(12) United States Patent
Kawasaki

(10) Patent No.: US 8,536,686 B2
(45) Date of Patent: Sep. 17, 2013

(54) SEMICONDUCTOR DEVICE

(75) Inventor: Hitoshi Kawasaki, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/418,949

(22) Filed: Mar. 13, 2012

(65) Prior Publication Data
US 2013/0009292 A1   Jan. 10, 2013

(30) Foreign Application Priority Data

Jul. 5, 2011 (JP) ................. 2011-149470

(51) Int. Cl.
*H01L 23/495* (2006.01)
(52) U.S. Cl.
USPC .... 257/666; 257/672; 257/676; 257/E23.031; 257/E23.037; 257/E23.039
(58) Field of Classification Search
USPC .... 257/99, 100, 666–676, E23.031–E23.059; 438/111, 112, 123, FOR. 366, FOR. 367, 438/FOR. 377, FOR. 380
See application file for complete search history.

(56) References Cited

U.S. PATENT DOCUMENTS 7,227,245 B1 * 6/2007 Bayan et al. ................. 257/666

FOREIGN PATENT DOCUMENTS

| JP | 2008-227075 | 9/2008 |
| JP | 2011-23484 | 2/2011 |
| JP | 2011-176265 | 9/2011 |

* cited by examiner

*Primary Examiner* — Jasmine Clark
(74) *Attorney, Agent, or Firm* — Oblon, Spivak, McClelland, Maier & Neustadt, L.L.P.

(57) ABSTRACT

According to an embodiment, a semiconductor device includes a first frame, a semiconductor element fixed to the first frame, a second frame, a third frame and a resin package. The second frame faces the first frame and is away from the first frame, the second frame being electrically connected to the semiconductor element via a metal wire. The resin package covers the semiconductor element, the first frame, and the second frame. The first frame and the second frame are exposed in one major surface of the resin package. The third frame juxtaposed to one of the first frame and the second frame, the third frame being continuously exposed from the major surface of the resin package to a side surface in contact with the major surface.

19 Claims, 6 Drawing Sheets

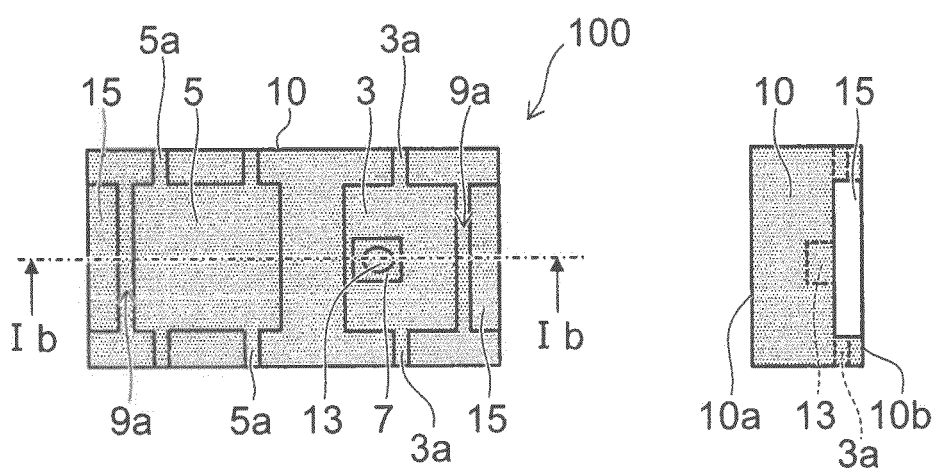
FIG. 1A
FIG. 1C
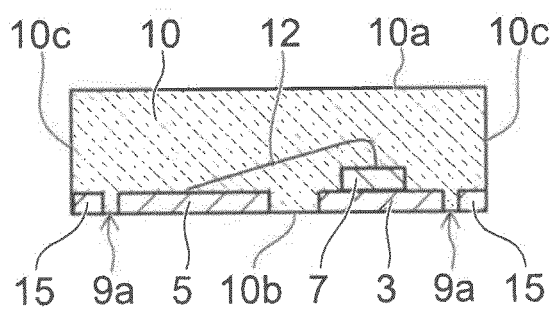
FIG. 1B

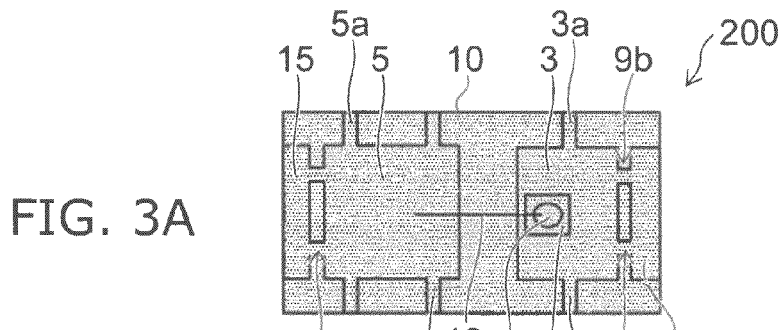
FIG. 3A
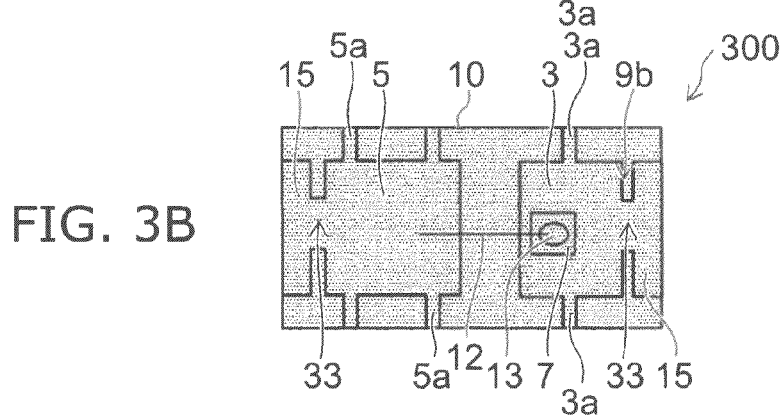
FIG. 3B
FIG. 4A
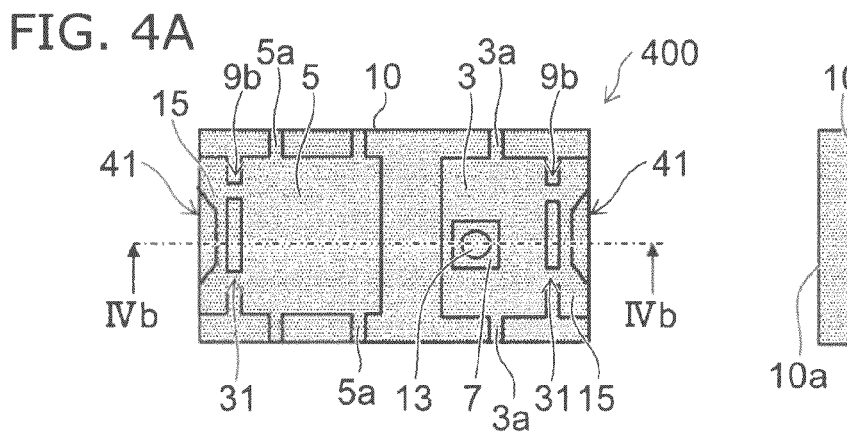
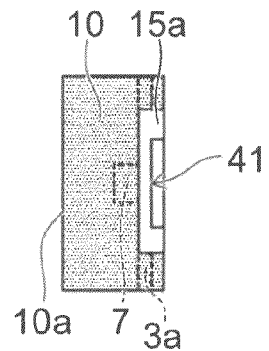
FIG. 4B
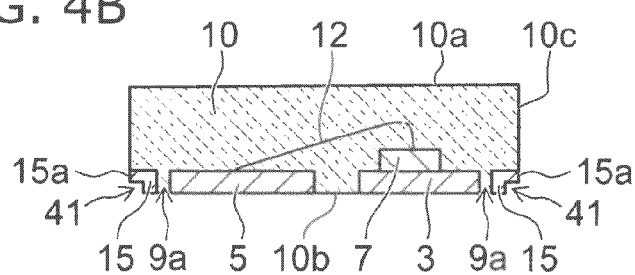
FIG. 4C

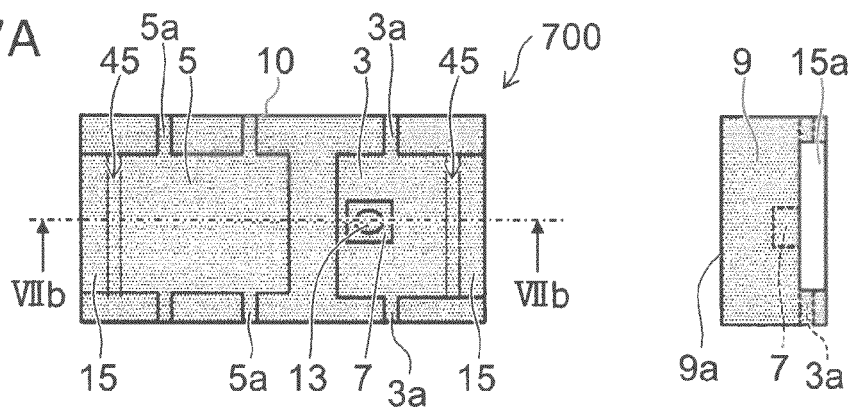
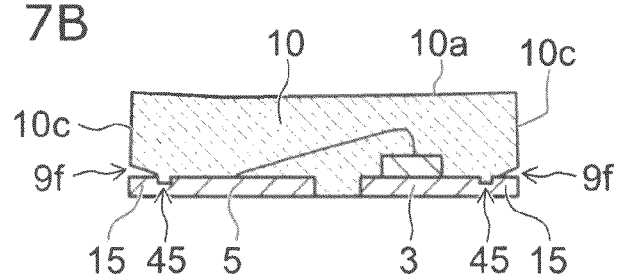
FIG. 7A
FIG. 7B
FIG. 7C
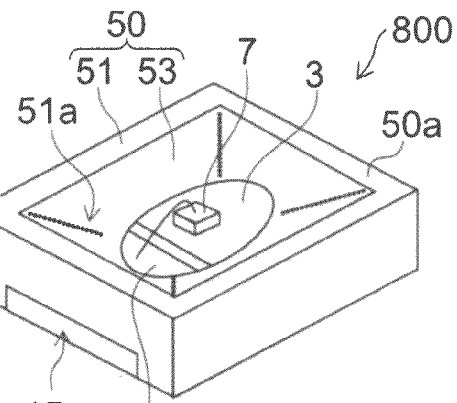
FIG. 8A
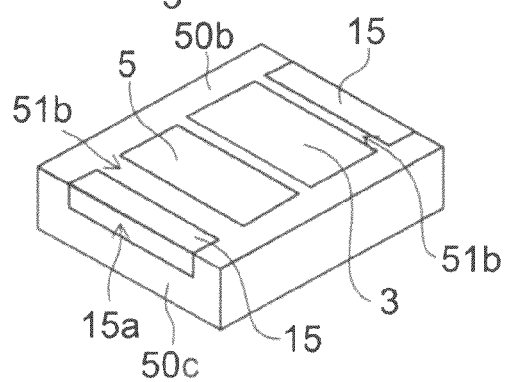
FIG. 8B

SEMICONDUCTOR DEVICE

CROSS-REFERENCE TO RELATED APPLICATIONS

This application is based upon and claims the benefit of priority from Japanese Patent Application No. 2011-149470, filed on Jul. 5, 2011; the entire contents of which are incorporated herein by reference.

FIELD

Embodiments are generally related to a semiconductor device.

BACKGROUND

To meet the demand for downsizing semiconductor devices, a surface mount package is widely used in which a metal frame serving as a bonding pad is provided at the back surface. The semiconductor devices having the surface mount package are mounted using the reflow soldering, for example, on a printed circuit board on which a solder paste is printed. It is confirmed that the semiconductor device is properly fixed to the printed circuit board, when a solder fillet is observed on the side surface of the package. That is, the solder wettability of the frame can be examined by observing the presence or absence of the fillet, which is the climbing-up solder formed on an end face of the frame that is exposed at the side surface of the package.

However, for example, the solder may penetrate into a gap between the resin package and the frame subsequently after climbing up the end surface of the frame, reducing the reliability of the semiconductor device. Therefore, it is desired for a semiconductor device to enhance the reliability by suppressing the solder intrusion at the side surface of the package.

BRIEF DESCRIPTION OF THE DRAWINGS

FIGS. 1A to 1C are schematic views illustrating a semiconductor device according to a first embodiment;

FIGS. 3A and 3B are schematic views illustrating a semiconductor device according to a second embodiment;

FIGS. 4A to 4C are schematic views illustrating a semiconductor device according to a variation of the second embodiment;

FIGS. 7A to 7C are schematic views illustrating a semiconductor device according to a fourth embodiment;

FIGS. 8A and 8B are schematic views illustrating a semiconductor device according to a fifth embodiment.

DETAILED DESCRIPTION

Figure 2A:
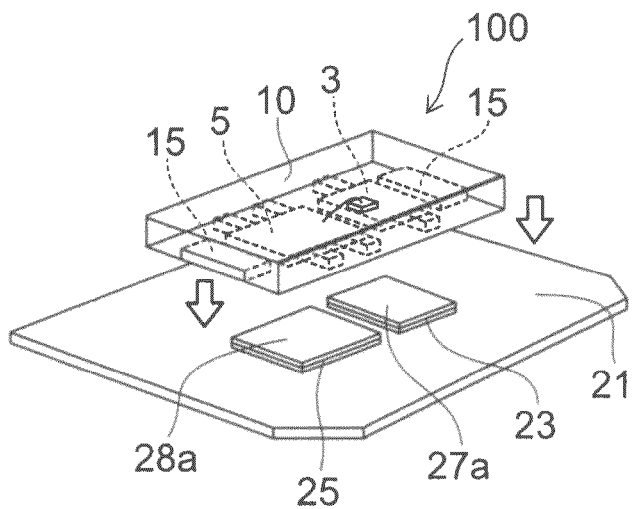
FIGS. 2A to 2C are schematic views illustrating a mounting process of the semiconductor device on a printed circuit board according to the first embodiment.

According to an embodiment, a semiconductor device includes a first frame, a semiconductor element fixed to the first frame, a second frame, a third frame and a resin package. The second frame faces the first frame and is away from the first frame, the second frame being electrically connected to the semiconductor element via a metal wire. The resin package covers the semiconductor element, the first frame, and the second frame. The first frame and the second frame are exposed in one major surface of the resin package. The third frame is juxtaposed to one of the first frame and the second frame, the third frame being continuously exposed from the major surface of the resin package to a side surface in contact with the major surface.

Hereinbelow, embodiments of the invention are described with reference to the drawings. Identical components in the drawings are marked with the same reference numerals, and a detailed description thereof is omitted as appropriate and different components are described.

First Embodiment

FIGS. 1A to 1C are schematic views showing a semiconductor device 100 according to a first embodiment. FIG. 1A is a plan view of the semiconductor device 100 as viewed from the side of the upper surface 10a. FIG. 1B is a cross sectional view taken along line Ib-Ib in FIG. 1A. FIG. 1C shows the side surface 10c at the short side in FIG. 1A.

The semiconductor device 100 includes a semiconductor element 7, a lead frame 3 that is a first frame, and a lead frame 5 that is a second frame. The semiconductor device 100 further includes a resin package 10 covering the semiconductor element 7, the lead frame 3, and the lead frame 5.

The semiconductor element 7 is fixed to the lead frame 3, and is electrically connected to the lead frame 5 via a metal wire 12. For example, one end of the metal wire 12 is bonded to an electrode 13 of the semiconductor element 7, and the other end is bonded to the surface (the upper surface) of the lead frame 5. The lead frame 5 is provided away from the lead frame 3, and is, for example, disposed side by side in the same plane.

Part of the lead frame 3 and part of the lead frame 5 are exposed in one major surface of the resin package 10. For example, as shown in FIG. 1B, the back surface of the lead frame 3 and the back surface of the lead frame 5 are exposed in the back surface 10b that is one major surface of the resin package 10. Here, the back surface 10b of the resin package 10 is, for example, a bonding face for mounting on a printed circuit board. The back surface of the lead frame 3 is the face opposite to the surface (the upper surface) on which the semiconductor element 7 is fixed, and the back surface of the lead frame 5 is the face opposite to the surface (the upper surface) to which one end of the metal wire 12 is bonded.

The semiconductor device 100 includes a lead frame 15 that is a third frame. The lead frame 15 is juxtaposed to one of the lead frames 3 and 5. As shown in FIG. 1A, one of two lead frames 15 is provided facing and being away from the lead frame 3 and the other is provided facing and being away from the lead frame 5, for example. As shown in FIGS. 1B and 1C, the lead frame 15 is continuously exposed from the back surface 10b to the side surface 10c at the bottom corner of the resin package 10. In other words, the exposed parts of the lead frame 15 at the end of the back surface 10b and at the end of the side surface 10c are connected each other at the corner between the back surface 10b and the side surface 10c. As described in the embodiment, two lead frames 15 may be provided adjacent to both of the lead frames 3 and 5, respectively. Alternatively, one lead frame 15 may be provided adjacent to the lead frames 3 or 5.

The lead frames 15 are provided with portions that define the boundaries with the lead frames 3 and 5. That is, as shown in FIGS. 1A and 1B, the boundary portions 9a are provided between the lead frame 3 and the lead frame 15 and between the lead frame 5 and the lead frame 15, respectively.

In a planar view parallel to the back surface 10b, hanging pins 3a and 5a are provided extending from the outer edges of the lead frames 3 and 5 toward the side surface of the resin package 10. The hanging pins 3a and 5a are, for example, provided so as to extend toward a side surface other than the side surface 10c in which part of the lead frame 15 is exposed.

The semiconductor element 7 is, for example, a light emitting diode (LED), and is fixed (die-bonded) on the upper surface of the lead frame 3, facing up the light emitting surface and making an electrode, provided on the back surface, face to the upper surface of the lead frame 3. The electrode 13 on the light emitting surface side is electrically connected to the lead frame 5 via the metal wire 12. In the semiconductor device 100, a drive current is passed between the lead frame 3 and the lead frame 5 to cause light emission from the LED, and the light is emitted outward through the upper surface 10a of the resin package 10.

Figure 2B:
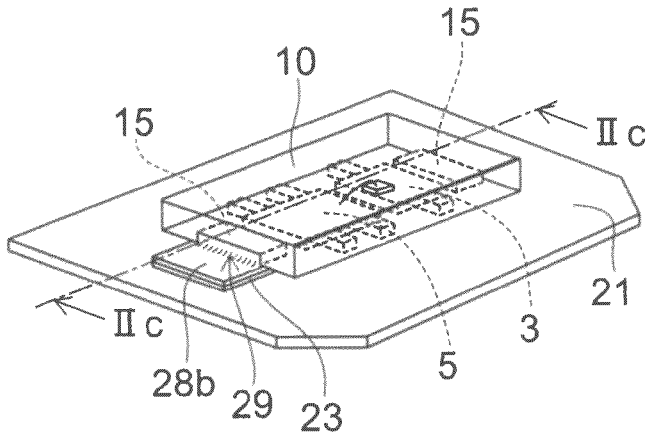
Figure 2C:
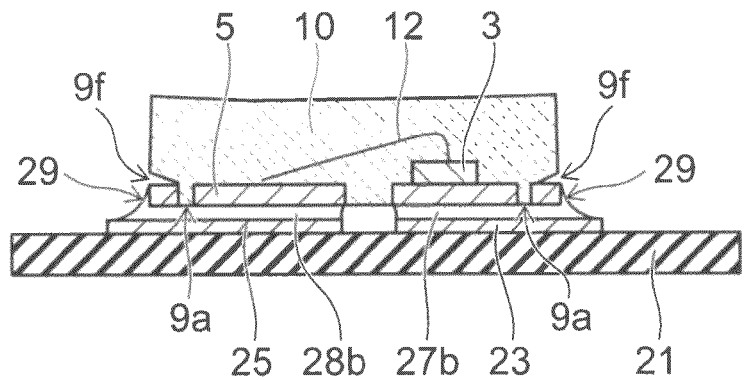

FIGS. 2A to 2C are schematic views showing a mounting process of the semiconductor device 100 on a printed circuit board 21 according to the first embodiment. FIG. 2A shows the process where the semiconductor device 100 is mounted onto the printed circuit board 21, and FIG. 2B shows the semiconductor device 100 fixed with solder to the printed circuit board 21. FIG. 2C is a cross-sectional view taken along line IIc-IIc in FIG. 2B.

As shown in FIG. 2A, the semiconductor device 100 is mounted onto land patterns 23 and 25 provided on the printed circuit board 21. The drawing shows a portion of the printed circuit board 21 where the land patterns 23 and 25 are provided. The semiconductor device 100 is mounted so that the land pattern 23 is in contact with the lead frame 3 and the lead frame 15 adjacent thereto and the land pattern 25 is in contact with the lead frame 5 and the lead frame 15 adjacent thereto. Solder pastes 27a and 28a are provided on the land patterns 23 and 25, for example.

Next, the printed circuit board 21 on which the semiconductor device 100 is mounted is heated in a reflow furnace. Thereby, the solvent is vaporized from the solder pastes 27a and 28a, and the solder contained therein are melted by the heating. After cooling the molten solder, the semiconductor device 100 is fixed to the printed circuit board 21 with the solders 27b and 28b. The molten solder 27b extendedly attaches to the surface of the lead frames 3 and 15, and the molten solder 28b extendedly attach to the surfaces of the lead frames 5 and 15 in the back surface of the resin package 10. Furthermore, when the lead frame 15 has a solder wettable surface, the solder climbs up the end surface of the lead frame 15 that is continuously exposed from the back surface to the side surface at a bottom corner of the resin package 10. Thus, a fillet 29 is formed on the end face as shown in FIGS. 2B and 2C.

For example, in the case where the lead frame 15 is not provided in the semiconductor device 100, no metal surface is exposed in the side surface of the resin package 10. Therefore, the fillet 29 shown in FIG. 2B is not formed, and the resin package 10 covers the joint surfaces of the lead frames 3 and 5, hindering a visual inspection. Consequently, it is impossible to examine the solder wettability between the lead frame 3 and the solder 27b and between the lead frame 5 and the solder 28b.

In contrast, in the semiconductor device 100 including the lead frame 15, the fillet 29 is formed on the side surface of the resin package 10. Therefore, it is possible to examine the solder wettability observing the presence or absence of the fillet, in order to select and remove the printed circuit board 21 including the semiconductor device 100 having insufficient adhesive strength. Thereby, the reliability of apparatuses can be improved by installing the printed circuit board 21 which pass the visual inspection.

Furthermore, a soldering iron can be put onto the fillet 29 to melt the solders 27b and 28b. Hence, it is possible to remove and replace the semiconductor device 100, when a defect is found in the electrical characteristics. Thereby the manufacturing costs of the printed circuit board 21 can be reduced.

Figure 9A:
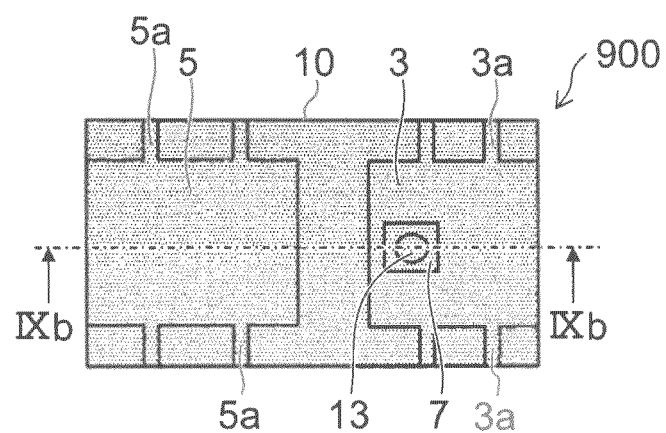
FIGS. 9A and 9B are schematic views illustrating a semiconductor device according to a comparative example.
Figure 9B:
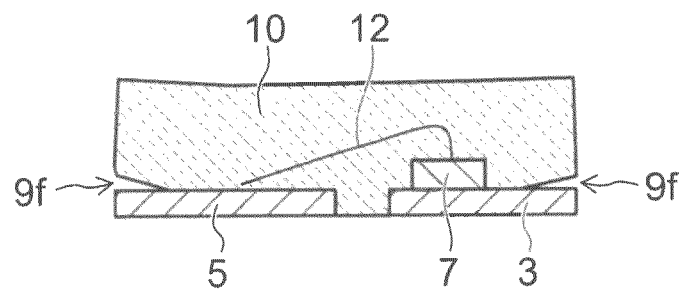

The heating in the reflow process may cause, the resin to shrink, wherein the resin package 10 is separated from the lead frame, making a gap 9f at the side surface of the resin package 10 as shown in FIG. 2C and FIG. 9B.

For example, according to a comparative example shown in FIGS. 9A and 9B, a semiconductor device 900 has a structure in which the end surfaces of the lead frames 3 and 5 are exposed in the side surface of the resin package 10. In such a structure, when the gap 9f is formed at the side surface of the resin package 10, the solder or flux that has climbed up the end surfaces of the lead frames 3 and 5 may penetrate into the resin package along the gap 9f and reach the vicinity of the semiconductor element 7 or the bonding portion of the metal wire 12. Thus, the sealing of the semiconductor element 7 is degraded, and the bonding strength is reduced between the metal wire 12 and the lead frame 5. Consequently, the reliability of the semiconductor device 100 may be reduced.

In contrast, in the semiconductor device 100 according to the embodiment, the boundary portion 9a may block the solder penetration along the gap 9f. Thereby, the reliability of the semiconductor device 100 is improved by suppressing the penetration of the solder or flux into the lead frames 3 and 5.

Furthermore, in the embodiment, the bonding yield of the semiconductor device 100 is also improved on the printed circuit board 21. For example, in the reflow process, the semiconductor device 100 may move easily floating on molten solder, and the fixing position thereof may become out of alignment. To prevent the misalignment, the lead frames 3 and 5 exposed in the back surface 10b of the resin package 10 are preferably provided so as to have shapes matched with a prescribed pad design. That is, the exposed portions of the lead frames 3 and 5 are provided within the outer edge of the back surface 10b.

For example, in the structure of the semiconductor device 900 shown in FIGS. 9A and 9B, the preferable design mentioned above and the fillet forming on the side surface of the resin package are contradictory requirements and both cannot be fulfilled. In contrast, in the embodiment, the exposed portions of the lead frames 3 and 5 and the lead frame 15 are provided away from each other via the boundary portion 9a. Thereby, the lead frames 3 and 5 may have the preferable shapes matched with a prescribed pad design, and a fillet can be provided on the end surface of the lead frame 15. Thus, it may suppress the positional misalignment of the semiconductor device 100, and improve the bonding yield.

Second Embodiment

FIGS. 3A and 3B are schematic views showing semiconductor devices according to a second embodiment. FIG. 3A shows a semiconductor device 200, and FIG. 3B shows a semiconductor device 300. As shown in the drawings, the lead frame 15 is connected to one of the lead frame 3 and the lead frame 5 by a connecting portion. At least one of the width and thickness of the connecting portion is different from those of the lead frames. In the embodiment, connecting pins 31 and 33 serve as the connecting portion.

For example, the semiconductor device 200 shown in FIG. 3A includes the lead frame 15 partly connected to the lead frame 3 by a plurality of connection pins 31. Although two connecting pins 31 are provided between the lead frame 3 and the lead frame 15 in the example shown in FIG. 3A, three or more connecting pins 31 may be provided therebetween. The connecting pin 31 may be provided with thinner thickness than the lead frame 3 and the lead frame 15. The same applies to the connecting pin 31 provided between the lead frame 5 and the lead frame 15.

The semiconductor device 300 shown in FIG. 3B includes the lead frame 15 partly connected to the lead frame 3 by the connecting pin 33. Although the connection pin 33 in the example shown in FIG. 3B is wider than the connecting pin 31 shown in FIG. 3A, the connecting pin 33 may have the same width with the connecting pin 31. The connection pin 33 may also be thinner than the lead frame 3 and the lead frame 15. That is, the semiconductor device 300 shown in FIG. 3B has a significant difference in the number of the connecting pins 33 from the semiconductor device 200 shown in FIG. 3A. The same applies also to the connecting pin 33 provided between the lead frame 5 and the lead frame 15.

The read frame 15 and 3 may be connected with the connecting pins whose number is different from the ones provided between the lead frame 5 and 15, and the connecting pins may be provided with the different width from each other.

The adhesive strength of the lead frame 15 to the molded resin can be increased by connecting to the lead frame 3 or 5 via the connecting pins. For example, the individual semiconductor devices are separated by cutting the lead frames 3, 5, 15 and a resin molded thereon using a dicing blade, wherein the lead frame 15 is cut into a small piece. Then, it may be possible to suppress the deformation and removal of the lead frame 15.

The boundary portions 9b define the boundaries between the lead frames 3 and 5 and the lead frame 15. The boundary portion 9b is divided into a plurality of portions by the connecting pin 31 or 33.

Also in the embodiment, the boundary portion 9b blocks the solder penetrating along the gap 9f (see FIG. 2C) formed at the side surface of the resin package 10. The shapes of the lead frames 3 and 5 exposed in the back surface 10b of the resin package 10 can be matched with a preferable design, and the positional misalignment of the semiconductor devices 200 and 300 can be suppressed in the reflow process.

FIGS. 4A to 4C are schematic views showing a semiconductor device 400 according a variation of the second embodiment. FIG. 4A is a plan view showing the upper surface 10a side of the resin package 10, and FIG. 4B is a cross-sectional view taken along line IVb-IVb in FIG. 4A. FIG. 4C shows the side surface 10c at the short side in FIG. 4A.

The lead frame 15 in the semiconductor device 400 differs from that in the semiconductor device 200 shown in FIG. 3A in that it includes a recess 41 provided at the corner between the back surface 10b and the side surface 10c of the resin package 10. That is, the lead frames 15 are connected to the lead frame 3 and 5 by the connecting pin 31, which provide the same advantage with the semiconductor device 200. Also in this case, the lead frame 15 is continuously exposed at the corner between the back surface 10b and the side surface 10c of the resin package 10. That is, the surface of the lead frame exposed in the back surface 10b and the surface exposed in the side surface 10c are continuously provided at the corner.

In the embodiment, solder extends into the recess 41 provided on the back surface of the lead frame 15, and this facilitates forming the fillet 29. For example, the end surface 15a cut by the dicing blade includes copper or the like that is the core material of the lead frame 15. Hence, the end surface 15a may be less wettable with the solder, causing unevenness in the fillet 29 formed thereon. In this regard, the inner surface of the recess 41 is plated with silver, for example, as same as the back surface of the lead frame 15 that is wettable with the solder. Thereby, the molten solder can extends along the inner surface of the recess 41, uniformly forming the fillet 29.

Figure 5A:
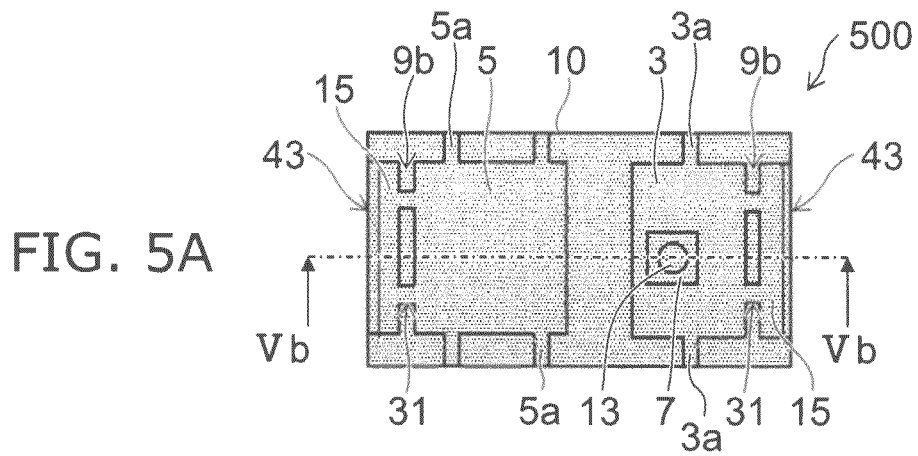
FIGS. 5A and 5B are schematic views illustrating a semiconductor device according to another variation of the second embodiment.
Figure 5B:
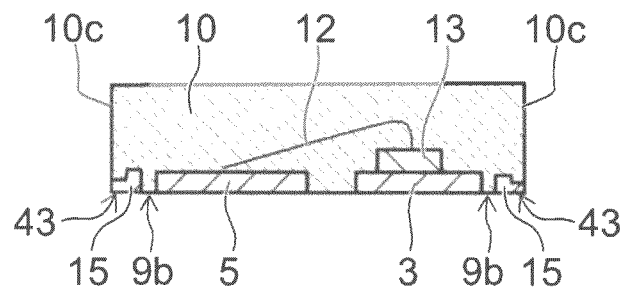

FIGS. 5A and 5B are schematic views showing a semiconductor device 500 according to another variation of the second embodiment. FIG. 5A shows a plan view of the upper surface 10a of the resin package 10, and FIG. 5B shows a cross section taken along line Vb-Vb in FIG. 5A.

In the semiconductor device 500, a step is provided at the upper surface of the lead frame 15, and the thickness of the end 43 of the lead frame 15 exposed in the side surface 10c is thinner than the thickness of the portion adjacent to the lead frames 3 or 5. The step may enhance the engagement between the resin package 10 and the lead frame 15, thereby it may suppress the solder or flux penetrating into the lead frames 3 and 5.

Third Embodiment

Figure 6A:
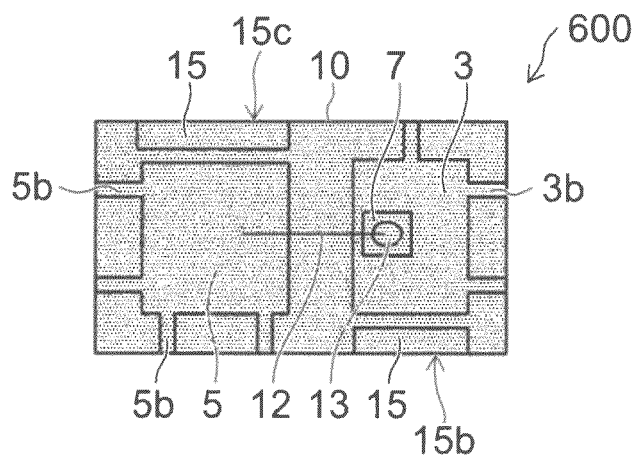
FIGS. 6A and 6B are schematic views illustrating a semiconductor device according to a third embodiment.
Figure 6B:
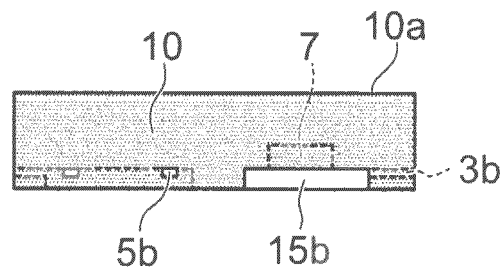

FIGS. 6A and 6B are schematic views showing a semiconductor device 600 according to a third embodiment. FIG. 6A shows a plan view of the upper surface 10a of the resin package 10, and FIG. 6B shows the side surface at the long side in FIG. 6A.

As shown in FIG. 6A, in the case where the resin package 10 has a rectangle shape in the plan view, the lead frame 15 may be provided on the long side. The lead frame 15 is provided facing and being away from the lead frames 3 or 5, and the end surfaces 15b and 15c thereof are exposed in the side surface of the long side.

Also the embodiment can provide the same advantage with the first embodiment. The connecting pin 31 may be provided between the lead frame 15 and the lead frames 3 or 5, and the lead frame 15 may include the recess 41 shown in FIGS. 4A to 4C or the step shown in FIGS. 5A and 5B.

As shown in FIG. 6B, in the embodiment, the end surfaces of the hanging pins 3b and 5b are exposed not only in the side surface of the short side where the lead frame 15 is not exposed but also in the side surface of the long side. Furthermore, for example, it is also possible that only hanging pins are provided extending from the outer edges of the lead frames 3 and 5 toward the side surface in the short side of the resin package 10 and no hanging pin extends toward the side surface of the long side.

In FIG. 6A, the end surfaces 15b and 15c of the lead frames 15 are individually exposed at both the long sides of the resin package 10. However, the embodiment is not limited to the example, but a configuration in which the end surface 15b or 15c is exposed only on one side is possible. In addition, it is also possible that both the lead frames 15 provided adjacent to the lead frame 3 and the lead frame 5 are provided along one side of the resin package 10, exposing the end surface 15b and 15c in the one side surface.

Fourth Embodiment

FIGS. 7A to 7C are schematic views showing a semiconductor device 700 according to a fourth embodiment. FIG. 7A shows a plan view of the upper surface 10a of the resin package 10, and FIG. 7B shows a cross section taken along line VIIb-VIIb in FIG. 7A. FIG. 7C shows the side surface 10c at the short side in FIG. 7A.

In the embodiment, a boundary portion 45 thinner than the lead frames 3 and 15 is provided between the lead frame 3 and the lead frame 15, serving as the connecting portion. As shown in FIG. 7B, in the boundary portion 45, a groove is formed between the upper surface of the lead frame 3 and the upper surface of the lead frame 15. The same applies also to the boundary portion 45 provided between the lead frame 5 and the lead frame 15. Furthermore, the lead frames 15 may include the recess 41 shown in FIGS. 4A to 4C and the step shown in FIGS. 5A and 5B.

The fillet 29 is formed on the end surface 15a of the lead frame 15 exposed in the side surface 10c of the resin package 10. The solder or flux penetrating into the gap 9f between the resin package 10 and the lead frame 15 is blocked by a resin buried in the groove of the boundary portion 45, not reaching the lead frames 3 and 5.

Fifth Embodiment

FIGS. 8A and 8B are schematic views showing a semiconductor device 800 according to a fifth embodiment. FIG. 8A is a perspective view of the semiconductor device 800 as viewed from the upper surface side of a resin package 50, and FIG. 8B is a perspective view as viewed from the back surface side of the resin package 50.

The resin package 50 of the semiconductor device 800 includes a resin frame 51 having a recess 51 on a front face side and a transparent resin 53 buried therein. As shown in FIG. 8A, at the bottom of a recess 51a, part of the lead frame 3 is exposed, and the semiconductor element 7 (e.g. an LED chip) is fixed thereon. Part of the lead frame 5 also exposed in the bottom surface is electrically connected to the semiconductor element 7 via the metal wire 12.

The resin frame 51 is, for example, a white resin containing titanium oxide, and reflects the light emitted from the LED chip. The recess 51a is filled with a transparent resin. Thereby, the light emitted from the LED chip fixed on the upper surface of the lead frame 3 is reflected at the inner surface of the resin frame 51 and emitted outward through the upper surface 50a of the resin package 50.

As shown in FIG. 8B, the back surfaces of the lead frames 3 and 5 are exposed on the backside 50b of the resin package 50. The lead frames 15 are provided via boundary portions 51b that defines the boundaries with the lead frames 3 and 5.

In regard to the lead frame 15, the back surface thereof is exposed on the backside 50b of the resin package 50, and the end surface 15a is exposed in the side surface 50c of the resin package 50. Thereby, the fillet 29 is formed on the side surface of the resin package 50. Furthermore, the solder or flux that penetrating into the gap between the resin package 50 and the lead frame 15 is blocked by a resin buried in the boundary portion 51b. Furthermore, the shapes of the lead frames 3 and 5 exposed on the back side 50b of the resin package 50 can be matched with a preferable design, and the positional misalignment of the semiconductor device 800 can be suppressed in the reflow process.

Although the semiconductor element 7 is described as an LED chip in the embodiments mentioned above, the semiconductor element 7 is not limited thereto but may be, for example, a light receiving element such as a light sensor or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first frame;
    a semiconductor element fixed to the first frame;
    a second frame facing the first frame and being away from the first frame, the second frame being electrically connected to the semiconductor element via a metal wire;
    a resin package covering the semiconductor element, the first frame, and the second frame, the resin package having a major surface and a plurality of side surfaces connected to the major surface, and the first frame and the second frame being exposed in the major surface of the resin package; and
    a plurality of third frames provided adjacent to both of the first frame and the second frame, one of the third frames being juxtaposed to the first frame and another one of the third frames being juxtaposed to the second frame, each of the third frames being continuously exposed from the major surface of the resin package to any one of side surfaces.

2. The device according to claim 1, wherein the first frame and the second frame are disposed side by side in the same plane.

3. The device according to claim 1, wherein the first frame and the second frame are exposed within an outer edge of the resin package in the major surface.

4. The device according to claim 1, wherein the one of the third frames is provided facing the first frame and being away from the first frame, and the another one of the third frames is provided facing the second frame and being away from the second frame.

5. The device according to claim 4, further comprising a plurality of connecting portions, one of the connecting portions being provided between the one of the third frames and the first frame, and another one of the connecting portions being provided between the other one of the third frames and the second frame,
    wherein the one of the connecting portions is different from the first frame in at least one of a width and a thickness, and the another one of the connecting portions is different from the second frame in at least one of a width and a thickness.

6. The device according to claim 5, wherein each of the connecting portions includes at least one connecting pin.

7. The device according to claim 6, wherein a connecting pin provided between the one of the third frames and the first frame is thinner than the first frame, and a connecting pin provided between the another one of the third frames and the second frame is thinner than the second frame.

8. The device according to claim 5, wherein one of the connecting portions provided between the one of the third frames and the first frame has the same width as the first frame, and another one of the connecting portions provided between the other one of the third frame and the second frame has the same width as the second frame;
    the one of the connecting portions is thinner than the first frame, and the another one of the connecting portions is thinner than the second frame; and each of the connecting portions has a groove provided on a side opposite to the major surface.

9. The device according to claim 4, wherein each of the third frames includes a recess provided at a corner between the major surface and the any one of the side surfaces.

10. The device according to claim 9, wherein an inner surface of the recess is plated with silver.

11. The device according to claim 4, wherein each of the third frames has an end exposed in the any one of the side surfaces, and the end is thinner than a portion adjacent to the one of the first frame and the second frame.

12. The device according to claim 6, wherein
a plurality of connecting pins are provided between the one of the third frames and the first frame; and
a plurality of connecting pins are provided between the another one of the third frames and the second frame,
wherein a number of the connection pins provided between the one of the third frames and the first frame is different from a number of the connection pins provided between the another one of the third frames and the second frame.

13. The device according to claim 6, wherein
a plurality of connecting pins are provided between the one of the third frames and the first frame; and
a plurality of connecting pins are provided between the another one of the third frames and the second frame,
wherein each of the connecting pins provided between the one of the third frames and the first frame has a different width from any one of the connecting pins provided between the another one of the third frames and the second frame.

14. The device according to claim 1, wherein the major surface of the resin package is a rectangle, and each of the third frames is provided along any one of short sides of the rectangle.

15. The device according to claim 1, wherein the major surface of the resin package is a rectangle, and each of the third frames is provided along any one of long sides of the rectangle.

16. The device according to claim 15,
wherein the one of the third frames is provided along one of long sides of the rectangle, and the another one of the third frames is provided along the other of long sides of the rectangle.

17. The device according to claim 15,
wherein the one of the third frames and the another one of the third frames are along one of long sides of the rectangle.

18. The device according to claim 1, wherein the first frame and the second frame include a plurality of hanging pins extending from outer edges of the first frame and the second frame toward a side surface where the third frames are not exposed.

19. The device according to claim 1, wherein the semiconductor element is a light emitting element;
the resin package includes a resin frame provided on a side opposite to the major surface and a transparent resin buried in a recess provided on the side opposite to the major surface;
the semiconductor element is fixed to the first frame exposed in a bottom surface of the recess; and
the resin frame reflects light emitted from the semiconductor element.

* * * * *